(12) United States Patent
Li

(10) Patent No.: US 8,922,218 B2
(45) Date of Patent: Dec. 30, 2014

(54) DETECTION CIRCUITS FOR BATTERIES

(75) Inventor: Guoxing Li, Sunnyvale, CA (US)

(73) Assignee: O2Micro Inc, Santa Clara, CA (US)

( * ) Notice: Subject to any disclaimer, the term of this patent is extended or adjusted under 35 U.S.C. 154(b) by 271 days.

(21) Appl. No.: 13/553,371

(22) Filed: Jul. 19, 2012

(65) Prior Publication Data

US 2013/0169282 A1    Jul. 4, 2013

Related U.S. Application Data

(60) Provisional application No. 61/580,899, filed on Dec. 28, 2011.

(51) Int. Cl.
*G01N 27/416* (2006.01)

(52) U.S. Cl.
USPC ............................................. 324/433

(58) Field of Classification Search
None
See application file for complete search history.

(56) References Cited

U.S. PATENT DOCUMENTS

| 5,747,978 | A | 5/1998 | Gariboldi et al. |
|---|---|---|---|
| 7,466,104 | B2 | 12/2008 | Wang et al. |
| 7,498,868 | B2 | 3/2009 | Sobue et al. |
| 7,508,165 | B2 | 3/2009 | Sobue et al. |
| 7,893,656 | B2 | 2/2011 | Sobue |
| 2010/0289497 | A1 * | 11/2010 | Lum-Shue-Chan et al. .. 324/426 |

FOREIGN PATENT DOCUMENTS

| CN | 1449085 A | 10/2003 |
|---|---|---|
| EP | 0992811 A2 | 4/2000 |
| JP | H08272470 A | 10/1996 |

OTHER PUBLICATIONS

Korean Office Action dated Nov. 11, 2013 issued in corresponding Korean Patent Application No. 10-2012-0110459 (5 pages).

* cited by examiner

*Primary Examiner* — Melissa Koval
*Assistant Examiner* — Daniel Miller

(57) ABSTRACT

A detection circuit includes a sensing unit, a signal reference source, and a detecting unit. The sensing unit provides a sensed signal by sensing an input signal representing a status of a battery. The signal reference source comprises a reference node and determines a signal reference at the reference node, and receives and is biased by the sensed signal at the same reference node to generate a trigger signal indicative of a difference between the sensed signal and the signal reference. The detecting unit is coupled to the signal reference source and generates an output signal according to the trigger signal to indicate an abnormal condition is present in the battery.

20 Claims, 6 Drawing Sheets

DETECTION CIRCUITS FOR BATTERIES

RELATED APPLICATIONS

The present application claims priority to the U.S. provisional application filed on Dec. 28, 2011, Ser. No. 61/580,899, hereby incorporated by reference in its entirety.

BACKGROUND

Portable devices such as laptop computers, cell phones, personal digital assistants, and the like, are becoming more common nowadays as the capabilities and utilities of such devices continue to expand. Many portable electronic devices are powered by a rechargeable battery, e.g., lithium, nickel-cadmium, or nickel-metal hydride type batteries, to facilitate the portable nature of such devices. Such portable electronic devices may also be powered by a DC (direct-current) power source when the situation permits, e.g., an AC/DC adapter is plugged into a conventional AC (alternating current) outlet. The DC power source may also provide power to recharge the rechargeable battery cells in a battery charging mode. In the battery charging mode, rechargeable battery cells are protected to avoid an over-voltage condition which may lead to cell burning.

FIG. 1 shows a block diagram of conventional detection circuitry 100 providing over-voltage protection (OVP) (hereinafter, OVP circuitry 100) for rechargeable battery cells. In the conventional OVP circuitry 100, a sense resistor string including resistors $R_{11}$ and $R_{12}$ is used to sense a voltage of a rechargeable battery cell 101. A voltage reference unit 103 provides a fixed reference voltage $V_{REF}$ to be compared with the sensed voltage $V_{SEN}$ via a comparator 105. The comparator 105 generates an output signal OVP if an over-voltage condition is present. When the sensed voltage $V_{SEN}$ is lower than the reference voltage $V_{REF}$, the output signal OVP is logic low, indicating that the cell voltage of the cell 101 is in a normal range. When the sensed voltage $V_{SEN}$ is higher than the reference voltage $V_{REF}$, the output signal OVP is logic high, indicating the occurrence of an over-voltage condition in the cell 101.

As shown in FIG. 1, the conventional OVP circuitry 100 has three DC current branches: a voltage reference unit branch, a sense resistor string branch and a comparator branch. The power consumption of these three DC current branches can be quite high; thus, the performance of the circuitry is inefficient. A circuit that addresses this shortcoming would be beneficial.

SUMMARY

In one embodiment, a detection circuit includes a sensing unit, a signal reference source, and a detecting unit. The sensing unit provides a sensed signal by sensing an input signal representing a status of a battery. The signal reference source, coupled to the sensing unit and comprising a reference node, determines a signal reference at the reference node, and the signal reference source receives and is biased by the sensed signal at the same reference node to generate a trigger signal indicative of a difference between the sensed signal and the signal reference. The detecting unit is coupled to the signal reference source and generates an output signal according to the trigger signal to indicate an abnormal condition is present in the battery.

BRIEF DESCRIPTION OF THE DRAWINGS

Features and advantages of embodiments of the subject matter will become apparent as the following detailed description proceeds, and upon reference to the drawings, wherein like numerals depict like parts, and in which.

DETAILED DESCRIPTION

Reference will now be made in detail to the embodiments of the present invention. While the invention will be described in conjunction with these embodiments, it will be understood that they are not intended to limit the invention to these embodiments. On the contrary, the invention is intended to cover alternatives, modifications and equivalents, which may be included within the spirit and scope of the invention.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Embodiments according to the present invention provide detection circuits for batteries, to detect an abnormal condition in the batteries. In one embodiment, the detection circuit detects an over-voltage condition or an under-voltage condition in the battery cell, to protect the battery cell from over-charging or over-discharging, respectively. Advantageously, the detection circuit has lower power consumption and simplified circuit structure relative to conventional designs.

Figure 1:
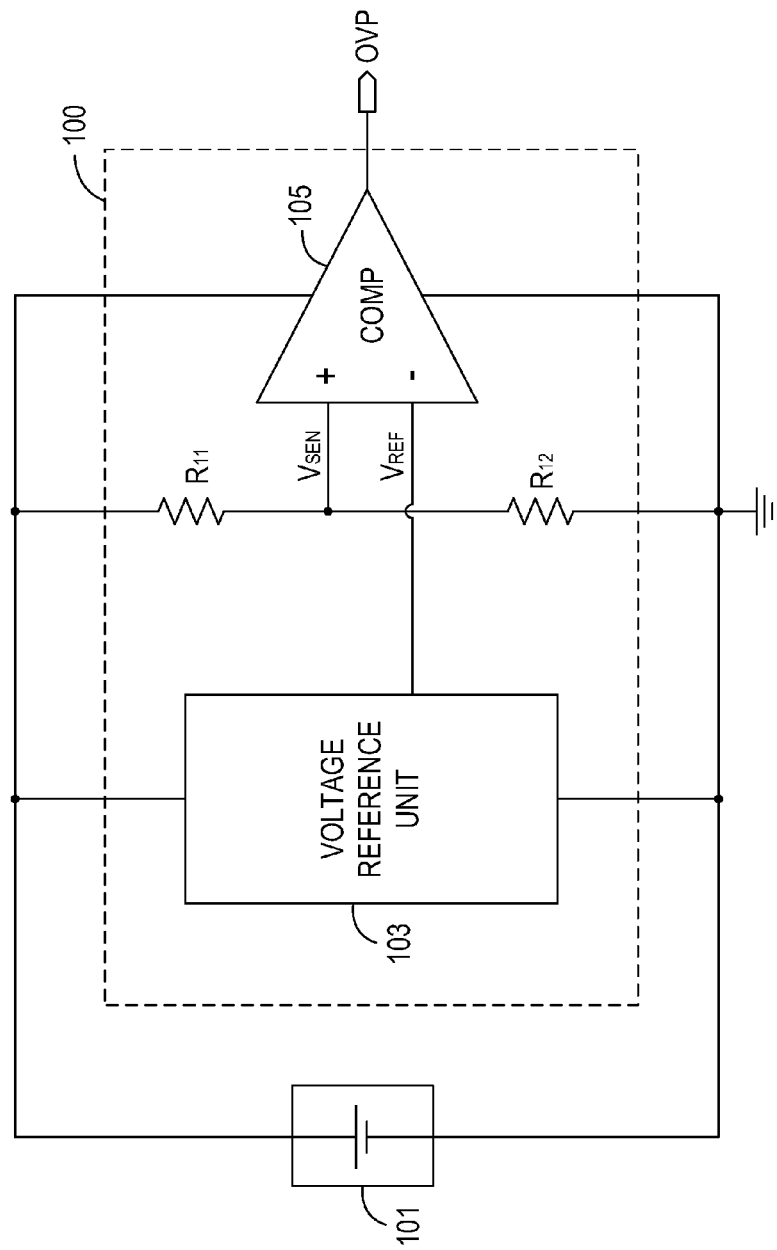
FIG. 1 shows a block diagram of conventional detection circuit providing over-voltage protection for rechargeable battery cells.
Figure 2:
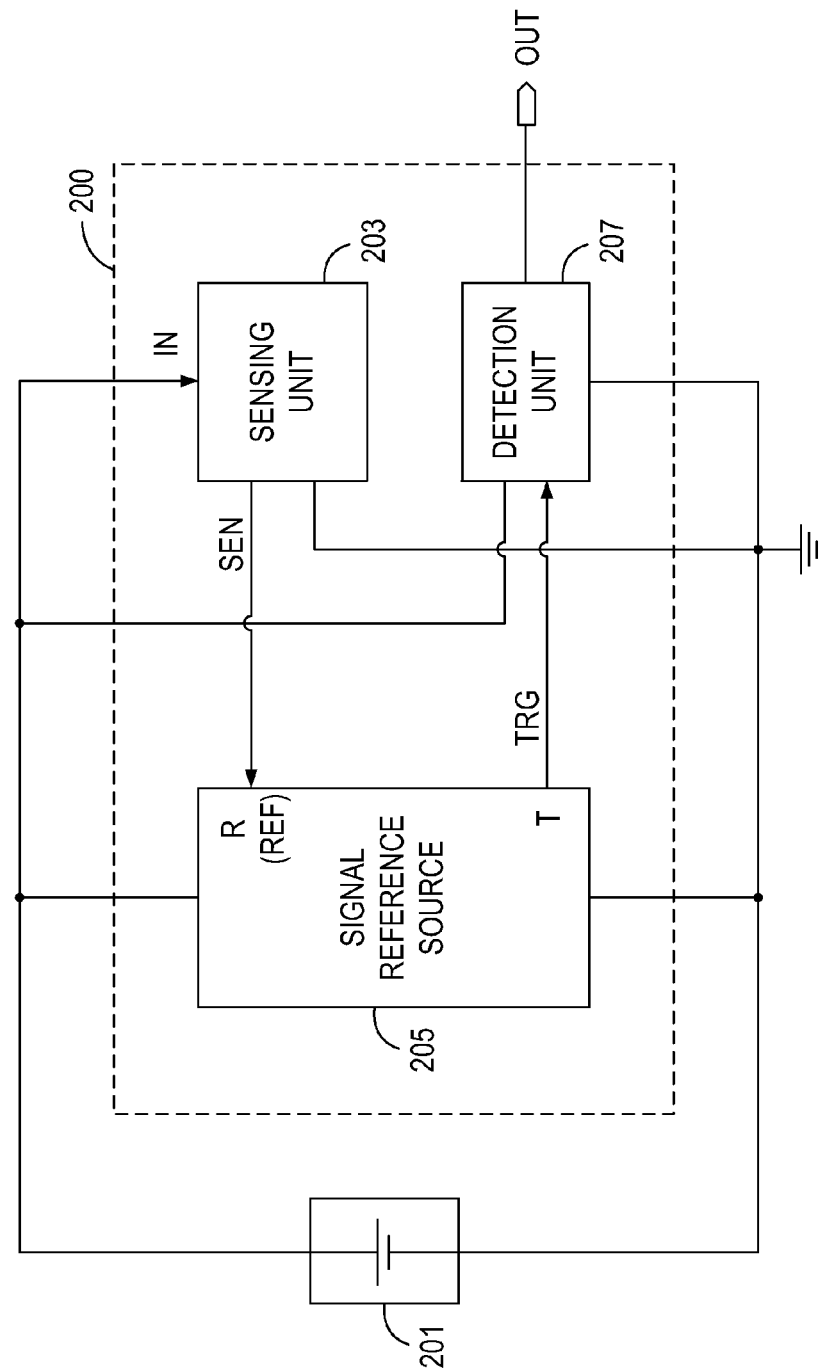
FIG. 2 illustrates a block diagram of an example of a detection circuit in accordance with one embodiment of the present invention.

FIG. 2 illustrates a block diagram of an example of a detection circuit 200 in accordance with one embodiment of the present invention. The detection circuit 200 includes a sensing unit 203, a signal reference source 205, and a detection unit 207. The sensing unit 203 senses an input signal IN and, as a result, provides a sensed signal SEN to a terminal R of the signal reference source 205. The input signal IN represents a status, e.g., a voltage level, of a battery cell 201. The signal reference source 205 receives the sensed signal SEN at the terminal R, and is biased by the sensed signal SEN to generate a trigger signal TRG at a terminal T. The signal reference source 205 also determines a signal reference REF at the terminal R. In one embodiment, the signal reference source 205 includes a bandgap reference circuit, the signal reference REF is a bandgap voltage reference that is substantially constant even if the ambient temperature varies, and the signal reference REF is determined according to the characteristic parameters of the internal components of the signal reference source 205. The technology for providing a bandgap reference is known in the art. In this embodiment, if the sensed signal SEN received at the terminal R is greater or less than the signal reference REF (in other words, if the terminal R is biased by a voltage level other than a level of the bandgap voltage reference), then the trigger signal TRG generated at the terminal T varies accordingly such that the trigger signal TRG is indicative of a difference between the sensed signal SEN and the signal reference REF. Advantageously, the accuracy of the detection circuit 200 can be improved because the signal reference REF has a substantially constant value. As used herein, "substantially constant" means the signal can deviate from a constant value because of, e.g., non-ideality of circuit components, but the deviation is within a range that can be neglected. The detection unit 207 generates an output signal OUT according to the trigger signal TRG. The output signal OUT indicates whether there is an abnormal condition in the battery cell 201.

As mentioned above, by receiving the sensed signal SEN as a bias signal, the biased signal reference source 205 compares the signal reference REF with the sensed signal SEN, and generates the trigger signal TRG to indicate the difference between the sensed signal SEN and the signal reference REF. Advantageously, a comparator or the like is not needed in the detection circuit 200. In other words, the signal reference source 205 incorporates a comparing function without increasing the current consumption of the signal reference source 205. Consequently, because a comparator or additional/other comparing devices are not utilized, the total power consumption and the cost of the detection circuit 200 are reduced.

Figure 3:
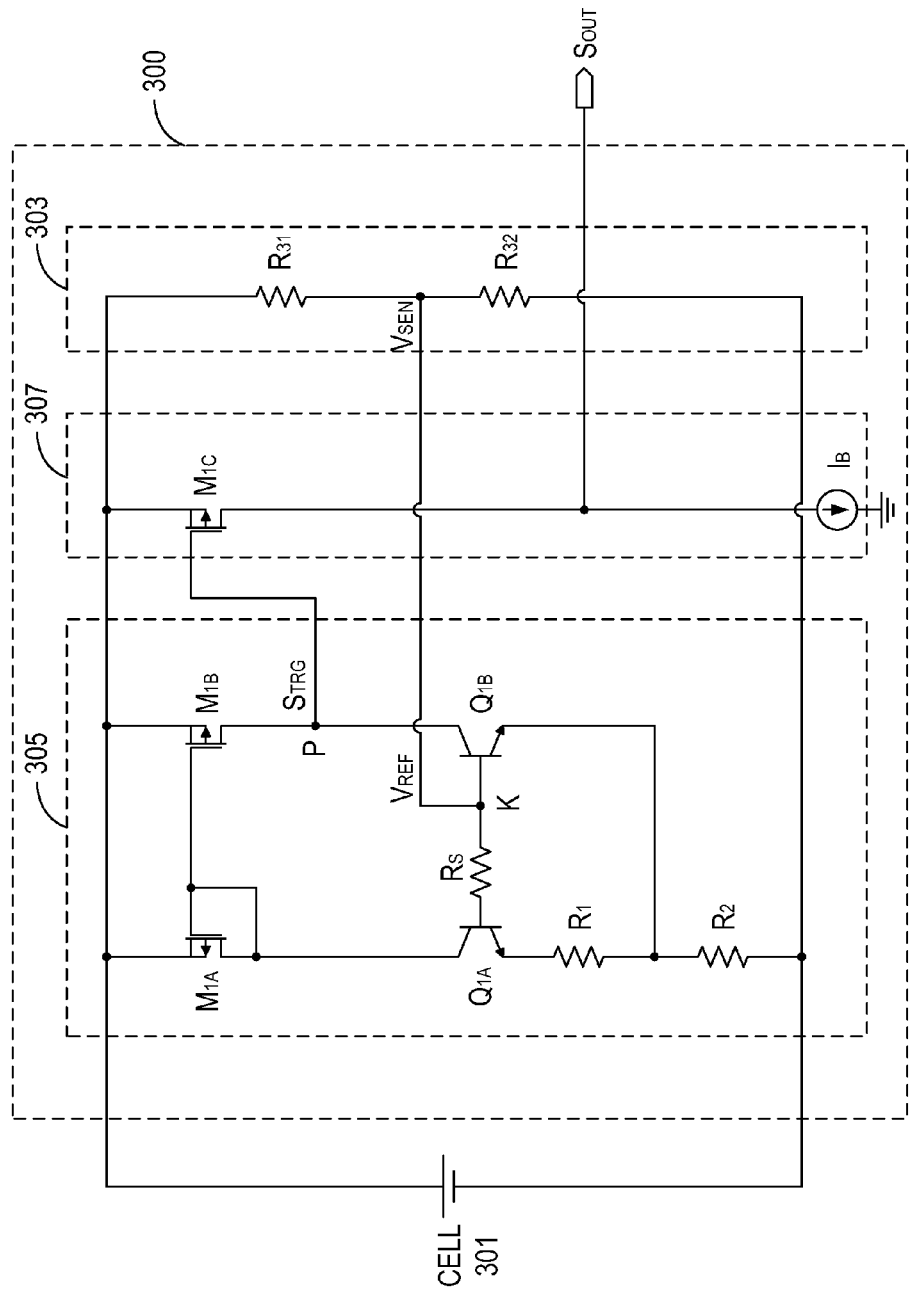
FIG. 3 illustrates a schematic diagram of an example of a detection circuit in accordance with one embodiment of the present invention.

FIG. 3 illustrates a schematic diagram of an example of a detection circuit 300 in accordance with one embodiment of the present invention. FIG. 3 is described in combination with FIG. 2. In this embodiment, the detection circuit 300 detects if there is an abnormal condition in a battery cell 301. The detection circuit 300 includes a sensing unit 303, a signal reference source 305, and a detecting unit 307. The sensing unit 303 includes a voltage divider that includes resistors $R_{31}$ and $R_{32}$ for sensing the voltage level of the cell 301, and provides a sensed voltage $V_{SEN}$ that corresponds to the voltage level of the cell 301. In one embodiment, the signal reference source 305 is a bandgap reference circuit capable of providing a bandgap voltage reference $V_{REF}$ that remains substantially constant if ambient temperature varies.

In the example of FIG. 3, the signal reference source 305 includes resistors $R_s$ and $R_1$, a pair of MOS (metal oxide semiconductor) transistors $M_{1A}$ and $M_{1B}$, and a pair of bipolar junction transistors $Q_{1A}$ and $Q_{1B}$. As shown in FIG. 3, the signal reference source 305, coupled to the sensing unit 303, comprises a reference node K and receives the sensed voltage $V_{SEN}$ at the reference node K, e.g., coupled to the terminal R in the embodiment of FIG. 2. The signal reference source 305 is biased by the sensed voltage $V_{SEN}$ to generate a trigger signal $S_{TRG}$ at a trigger node P, e.g., coupled to the terminal T in the embodiment of FIG. 2. To be specific, the bipolar junction transistors $Q_{1A}$ and $Q_{1B}$ are coupled via the reference node K and are biased by the sensed voltage $V_{SEN}$ at the reference node K. The reference voltage $V_{REF}$ is also determined by the signal reference source 305 at the reference node K. Thus, the signal reference source 305, e.g., the bandgap reference circuit, compares the sensed voltage $V_{SEN}$ with the reference voltage $V_{REF}$ to generate the trigger signal $S_{TRG}$ indicative of a difference between the sensed voltage $V_{SEN}$ and the reference voltage $V_{REF}$. The detecting unit 307 includes a switch and a current source $I_B$. The switch includes a PMOS (p-channel metal oxide semiconductor) transistor (hereinafter, a PMOS switch) $M_{1C}$ as shown in FIG. 3. The detecting unit 307 detects the trigger signal $S_{TRG}$ at the trigger node P of the signal reference source 305 and generates an output signal $S_{OUT}$. The PMOS switch $M_{1C}$ is controlled by the trigger signal $S_{TRG}$, and the output signal $S_{OUT}$ is generated according to a state of the PMOS switch $M_{1C}$.

In one embodiment, if the sensed voltage $V_{SEN}$ is equal to the reference voltage $V_{REF}$, the trigger signal $S_{TRG}$ has a voltage level that controls the gate-source voltage $V_{GS}$ of the PMOS switch $M_{1C}$ of the detecting unit 307, such that the gate-source voltage $V_{GS}$ is equal to a threshold voltage $V_{TH}$ of the PMOS switch $M_{1C}$. If the sensed voltage $V_{SEN}$ is greater than the reference voltage $V_{REF}$, the trigger signal $S_{TRG}$ can decrease to a voltage level such that the gate-source voltage $V_{GS}$ of the PMOS switch $M_{1C}$ is greater than the threshold voltage $V_{TH}$, and therefore the PMOS switch $M_{1C}$ is in a first state, e.g., the PMOS switch $M_{1C}$ is turned on. If the sensed voltage $V_{SEN}$ is less than the reference voltage $V_{REF}$, the trigger signal $S_{TRG}$ can increase to a voltage level such that the gate-source voltage $V_{GS}$ of the PMOS switch $M_{1C}$ is less than the threshold voltage $V_{TH}$, and therefore the PMOS switch $M_{1C}$ is in a second state, e.g., the PMOS switch $M_{1C}$ is turned off.

In one embodiment, the reference voltage $V_{REF}$ represents an over-voltage threshold of the cell 301, so that if the sensed voltage $V_{SEN}$ is greater than the reference voltage $V_{REF}$, it indicates that an over-voltage condition is present in the cell 301. More specifically, in one such embodiment, resistances of the resistors $R_{31}$ and $R_{32}$ are chosen such that the sensed voltage $V_{SEN}$ is less than the reference voltage $V_{REF}$ when the cell voltage of the cell 301 is in a normal range. In that case, the trigger signal $S_{TRG}$ indicating the difference between the sensed signal $V_{SEN}$ and the reference voltage $V_{REF}$ is at a high enough level to turn off the PMOS switch $M_{1C}$ of the detecting unit 307, such that the output signal $S_{OUT}$ is at a first level, e.g. logic low. When the cell 301 is being charged such that the cell voltage of the cell 301 is increasing and, as a result, the sensed voltage $V_{SEN}$ increases to where it is substantially equal to the reference voltage $V_{REF}$, then the trigger signal $S_{TRG}$ begins to ramp down and the output signal $S_{OUT}$ remains logic low. If an over-voltage condition is present in the cell 301, then the sensed voltage $V_{SEN}$ will be greater than the reference voltage $V_{REF}$, and the trigger signal $S_{TRG}$ has a low enough level to turn on the PMOS switch $M_{1C}$, such that the output signal $S_{OUT}$ is at a second level, e.g., logic high.

In another embodiment, the reference voltage $V_{REF}$ represents an under-voltage threshold of the cell 301, so that if the sensed voltage $V_{SEN}$ is less than the reference voltage $V_{REF}$, it indicates that an under-voltage condition is present in the cell 301. More specifically, in one such embodiment, resistances of the resistors $R_{31}$ and $R_{32}$ are chosen such that the sensed voltage $V_{SEN}$ is greater than the reference voltage $V_{REF}$ when the cell voltage of the cell 301 is in a normal range. If the sensed voltage $V_{SEN}$ is less than reference voltage $V_{REF}$, an under-voltage condition is considered to occur to the cell 301. The under-voltage detecting process is similar to the over-voltage detecting process except that, when the sensed voltage $V_{SEN}$ is greater than the reference voltage $V_{REF}$, the output signal $S_{OUT}$ is at the second level, e.g., logic high, to indicate the cell 301 is in the normal range; and when the sensed voltage $V_{SEN}$ is less than the reference voltage $V_{REF}$, the output signal $S_{OUT}$ is at the first level, e.g., logic low, to indicate an under-voltage condition in the cell 301. The over-voltage and the under-voltage examples are for illustration only, and are not intended to limit this invention. The detection circuit 300 can be used for detecting other abnormal conditions, such as an over-current condition and an under-current condition.

In one embodiment, when the PMOS switch $M_{1C}$ is in the first state, e.g., turned on, there are three DC current branches in the detection circuit 300: a sensing unit branch, a detecting unit branch, and a signal reference source branch. Advantageously, the current flowing through the detecting unit branch is determined by the current source $I_B$, such that the current flowing through the detecting unit branch can be a relatively small value, reducing the overall power consumption of the detection circuit 300 compared with conventional designs. When the PMOS switch $M_{1C}$ is in the second state, e.g., turned off, there are two DC current branches in the detection circuit 300: the sensing unit branch and the signal reference source branch. Thus, the power consumption of the detection circuit 300 is lower relative to conventional designs. Moreover, since the bandgap reference circuit included in the signal reference source 305 is a temperature-independent reference unit, then the reference voltage $V_{REF}$ determined by the signal reference source 305 at the reference node K has a stable value that is not affected by temperature. Advantageously, when the sensed voltage $V_{SEN}$ generated by the sensing unit 303 is provided to the reference node K to bias the signal reference source 305, the reference voltage $V_{REF}$ and the sensed voltage $V_{SEN}$ are compared without using a comparator or the like. Thus, the detection circuit 300 implements a battery-protection function but, relative to conventional designs, has a simplified structure with lower power consumption.

Furthermore, in the aforementioned detecting process, the sensed voltage $V_{SEN}$, which is representative of the voltage level of the cell 301, is compared with the reference voltage $V_{REF}$ determined by the signal reference source 305. The sensed voltage $V_{SEN}$ is linearly proportional to the voltage level of the cell 301, e.g., $V_{SEN}=V_{CELL}*R_{32}/(R_{31}+R_{32})$, where $V_{CELL}$ represents the cell voltage of the cell 301, and $R_{31}$ and $R_{32}$ represent the resistance values of the resistors $R_{31}$ and $R_{32}$ respectively. As mentioned above, in one embodiment, when the cell voltage of the cell 301 is in the normal range, the sensed voltage $V_{SEN}$ is less than the reference voltage $V_{REF}$. When the cell 301 is in the battery charging mode and the cell voltage increases to an over-voltage threshold $V_{CELL\_OV}$, where $V_{CELL\_OV}=V_{SEN\_OV}*(R_{31}+R_{32})/R_{32}$, which indicates the occurrence of the over-voltage condition in the cell 301, the sensed voltage, e.g., $V_{SEN\_OV}$, reaches the reference voltage $V_{REF}$ representing the over-voltage threshold $V_{CELL\_OV}$. In other words, according to the equation $V_{CELL\_OV}=V_{SEN\_OV}*(R_{31}+R_{32})/R_{32}$, where $V_{SEN\_OV}=V_{REF}$, the over-voltage threshold $V_{CELL\_OV}$ for the cell 301 is determined by the value of $(R_{31}+R_{32})/R_{32}$. Advantageously, a level of over-voltage protection for the cell 301, e.g., indicated by the over-voltage threshold $V_{CELL\_OV}$, can be set by choosing resistors $R_{31}$ and $R_{32}$ that have resistance values providing that level of protection. Similarly, in another embodiment, an under-voltage threshold $V_{CELL\_UN}$ of the cell 301 is determined by the value of $(R_{31}+R_{32})/R_{32}$, and a level of under-voltage protection to the cell 301, e.g., indicated by the under-voltage threshold $V_{CELL\_UN}$ can be set by choosing resistors $R_{31}$ and $R_{32}$ that have resistance values providing that level of protection.

Figure 4:
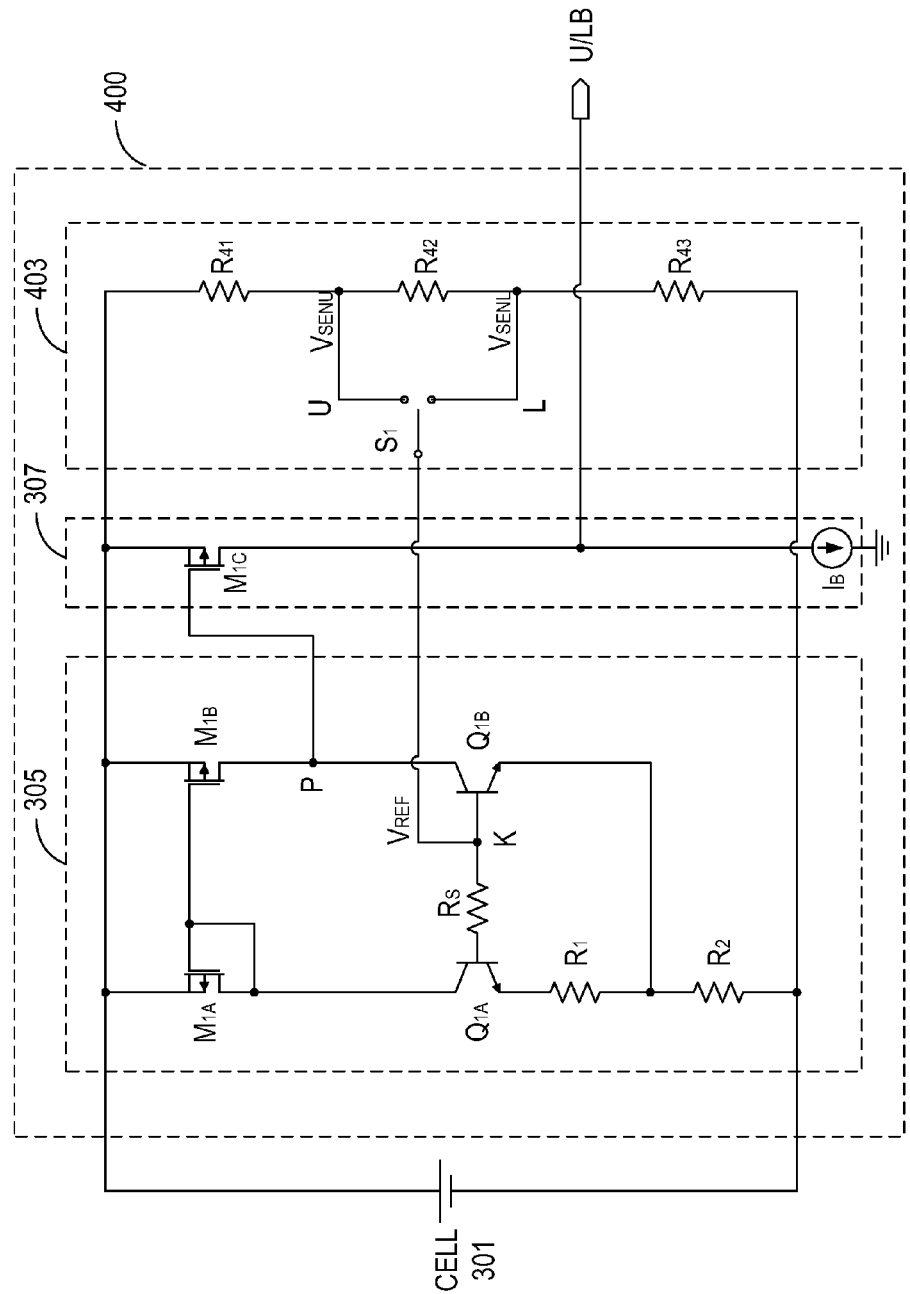
FIG. 4 illustrates a schematic diagram of an example of a detection circuit in accordance with another embodiment of the present invention.

FIG. 4 illustrates a schematic diagram of an example of a detection circuit 400 in accordance with another embodiment of the present invention. FIG. 4 is described in combination with FIG. 2 and FIG. 3. In this embodiment, the detection circuit 400 includes a sensing unit 403, the signal reference source 305, and the detecting unit 307. The sensing unit 403 distinguishes the detection circuit 400 from the detection circuit 300 in that the sensing unit 403 provides two signal levels, e.g., an upper-side sensed voltage $V_{SENU}$ and a lower-side sensed voltage $V_{SENL}$. The sensing unit 403 includes three resistors $R_{41}$, $R_{42}$ and $R_{43}$ to provide the upper-side sensed voltage $V_{SENU}$ and the lower-side sensed voltage $V_{SENL}$ by sensing a voltage level of the cell 301. This is for illustration only, and is not intended to limit this invention. In another embodiment, the sensing unit 403 can include more than three resistors to provide more than two signal levels.

In one embodiment, the detection circuit 400 can be used for the detection of over-voltage and under-voltage conditions. The sensing unit 403 includes a feedback switch $S_1$ for selectively providing one of the signal levels, e.g., the upper-side sensed voltage $V_{SENU}$ or the lower-side sensed voltage $V_{SENL}$, to bias the signal reference source 305. For example, if the feedback switch $S_1$ is switched to a "U" side, the detection circuit 400 can detect an under-voltage condition; or, if the feedback switch $S_1$ is switched to an "L" side, the detection circuit 400 can detect an over-voltage condition. The over-voltage and under-voltage detecting processes executed by the detection circuit 400 are similar to the detecting processes executed by the detection circuit 300. Similar to the embodiment of FIG. 3, an over-voltage threshold $V_{CELL\_OV}$ and under-voltage threshold $V_{CELL\_UN}$ of the cell 301 can be given by: $V_{CELL\_OV}=V_{REF}*(R_{41}+R_{42}+R_{43})/R_{43}$ and $V_{CELL\_UN}=V_{REF}*(R_{41}+R_{42}+R_{43})/(R_{42}+R_{43})$, where $R_{41}$, $R_{42}$ and $R_{43}$ represent the resistance values of the resistors $R_{41}$, $R_{42}$ and $R_{43}$, respectively. Therefore, levels of over-voltage and under-voltage protection to the cell 301 are respectively determined by the value of $(R_{41}+R_{42}+R_{43})/R_{43}$ and the value of $(R_{41}+R_{42}+R_{43})/(R_{42}+R_{43})$. The levels of over-voltage protection and under-voltage protection of the cell 301 can be set by choosing appropriate resistance values for the resistors $R_{41}$, $R_{42}$ and $R_{43}$.

In another embodiment, the detection circuit 400 can be used for the detection of multiple levels of over-voltage protection. By way of example, the cell 301 can have a first over-voltage threshold $V_{CELL\_OV1}$ and a second over-voltage threshold $V_{CELL\_OV2}$ that provide a first level of over-voltage protection and a second level of over-voltage protection to the cell 301. The first level of over-voltage protection can be performed when the feedback switch $S_1$ is switched to the "U" side, and the second level of over-voltage protection can be performed when the feedback switch $S_1$ is switched to the "L" side. Similar to the description above, the first and second over-voltage thresholds $V_{CELL\_OV1}$ and $V_{CELL\_OV2}$ can be set by choosing appropriate resistance values for the resistors $R_{41}$, $R_{42}$ and $R_{43}$. Similarly, in yet another embodiment, the detection circuit 400 can be used for the detection of multiple levels of under-voltage protection, and the cell 301 can have multiple under-voltage thresholds.

The detection circuit 400 can further include a control unit (not shown in FIG. 4) that provides a control signal to control the switch $S_1$ of the sensing unit 403. Alternatively, the control unit can be an external device that provides the control signal to the detection circuit 400. The control signal controls the switch $S_1$ to be switched to the "U" side or the "L" side periodically. The output signal U/LB generated from the detecting unit 307, indicating an abnormal condition, can be combined with the control signal to identify whether the abnormal condition is an over-voltage condition or an under-voltage condition. By way of example, when the control signal switches the switch $S_1$ to the "U" side, the detection circuit 400 can detect an under-voltage condition in the cell 301. If the output signal U/LB generated from the detecting unit 307 is logic high, the voltage level of the cell 301 falls within a normal range, and no abnormal condition is detected; or if the output signal U/LB is logic low, the detection circuit 400 detects an under-voltage condition in the cell 301. Similarly, when the control signal switches the switch $S_1$ to the "L" side, the detection circuit 400 can detect an over-voltage condition in the cell 301. If the output signal U/LB is logic low, the voltage level of the cell 301 falls within the normal range, and no abnormal condition is detected; or if the output signal U/LB is logic high, the detection circuit 400 detects an over-voltage condition in the cell 301.

In another embodiment, the control signal controls the switch $S_1$ to be switched between more than two sides manually or periodically, so that the detection circuit 400 can provide multiple levels of over-voltage protection and/or under-voltage protection, as mentioned above. The control signal can be combined with the output signal U/LB to identify the level of protection against the abnormal condition in the cell 301, and to further identify whether the abnormal condition is an over-voltage condition or an under-voltage condition.

The over-voltage and under-voltage conditions are only examples, and are not intended to limit the invention. Other abnormal conditions, such as an over-current condition and an under-current condition, can also be detected by the detection circuit 400.

Figure 5:
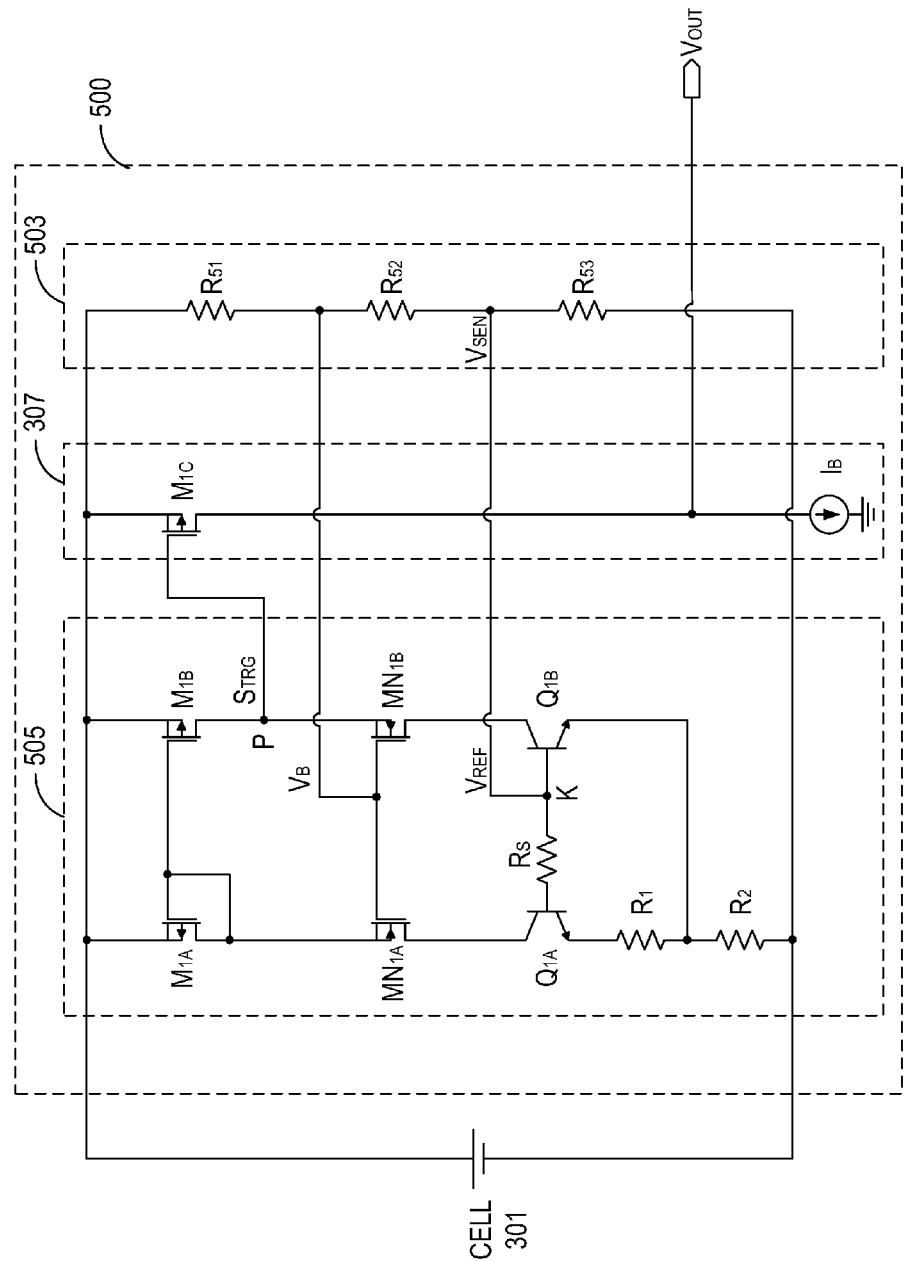
FIG. 5 illustrates a schematic diagram of an example of a detection circuit in accordance with another embodiment of the present invention.

FIG. 5 illustrates a schematic diagram of an example of a detection circuit 500 in accordance with another embodiment of the present invention. FIG. 5 is described in combination with FIG. 2 and FIG. 3. The detection circuit 500 includes a sensing unit 503, a signal reference source 505, and the detecting unit 307. The sensing unit 503 includes series-coupled resistors $R_{51}$, $R_{52}$ and $R_{53}$ to provide a sensed voltage $V_{SEN}$ and a bias voltage $V_B$. The signal reference source 505 in FIG. 5 is similar to the signal reference source 305 in FIG. 3 except that the signal reference source 505 also includes a pair of MOS transistors $MN_{1A}$ and $MN_{1B}$ with cascode structure. The pair of MOS transistors $MN_{1A}$ and $MN_{1B}$ is biased by the voltage $V_B$ provided by the sensing unit 503.

The signal reference sources in the embodiments of FIG. 3 and FIG. 5 also function as a first-stage amplifying unit, the trigger signal $S_{TRG}$ at the trigger node P can serve as an output signal of the first-stage amplifying unit, and the trigger signal $S_{TRG}$ is indicative of the difference between the sensed voltage $V_{SEN}$ and the reference voltage $V_{REF}$. The gain of the output signal of an amplifying unit is determined by the output impedance of the amplifying unit. Comparing the embodiment in FIG. 5 with the embodiment in FIG. 3, the output impedance of the signal reference source 505 is increased by adding the pair of MOS transistors $MN_{1A}$ and $MN_{1B}$. Consequently, the gain of the signal reference source 505 in the embodiment of FIG. 5 is greater than the gain of the signal reference source 305 in FIG. 3. Advantageously, with greater gain, the comparison result of the reference voltage $V_{REF}$ and the sensed voltage $V_{SEN}$ is more accurate. As a result, the accuracy of the detection circuit 500 is improved. Structures other than MOS transistors can be integrated into the signal reference source to improve the gain of the output signal of the signal reference source.

The pair of MOS transistors $MN_{1A}$ and $MN_{1B}$ is biased by the voltage $V_B$ generated from the sensing unit 503; thus, no other biasing circuit is needed. Consequently, the accuracy of the detection circuit 500 is improved without making the circuit more complicated or increasing its cost.

In one embodiment, similar to the resistors $R_{31}$ and $R_{32}$ in FIG. 3, the resistors $R_{51}$, $R_{52}$ and $R_{53}$ in FIG. 5 can be chosen such that the detection circuit 500 can detect either an over-voltage condition or an under-voltage condition. However, in another embodiment, the resistors $R_{52}$ and $R_{53}$ in FIG. 5 can be replaced by three resistors, e.g., similar to the resistors $R_{41}$, $R_{42}$ and $R_{43}$ in FIG. 4, or replaced by some other number of resistors, such that the detection circuit 500 can provide different levels of protection and selectively operate in an over-voltage detection mode or an under-voltage detection mode in a manner similar to the detection circuit 400 in FIG. 4.

The detection circuits provided by the embodiments of FIG. 2, FIG. 3, FIG. 4 and FIG. 5 detect if there is an abnormal condition occurring in a battery cell, e.g. cell 201 or 301. However, multiple battery cells can be monitored using multiple detection circuits, with each detection circuit (e.g., the detection circuit 200, 300, 400 or 500 provided in the embodiments of this invention) monitoring a corresponding battery cell. The output signals generated from the detection circuits can be combined to indicate the occurrence of an abnormal condition in one or more of the battery cells, or each output signal generated from the detection circuits can be obtained separately to indicate the occurrence of an abnormal condition of a corresponding battery cell.

Figure 6:
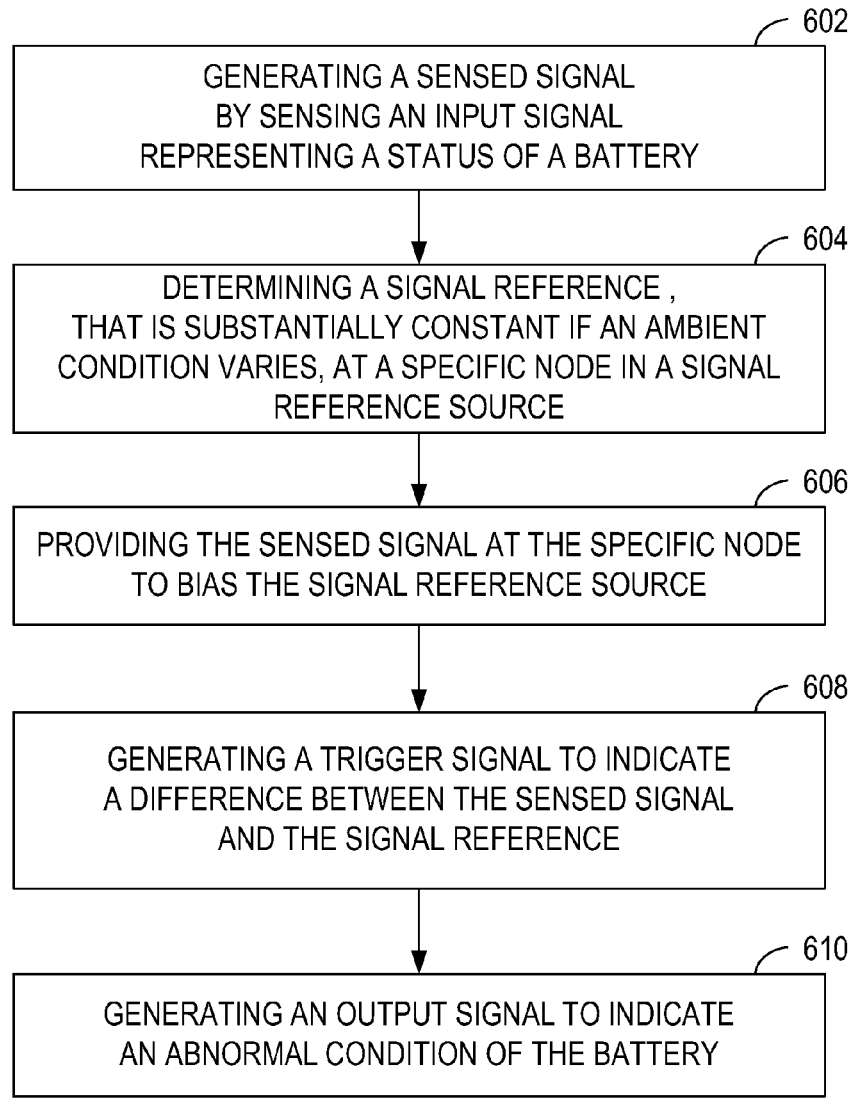
FIG. 6 illustrates a flowchart of examples of operations performed by a detection circuit, in accordance with one embodiment of the present invention.

FIG. 6 illustrates a flowchart of examples of operations performed by a detection circuit, in accordance with one embodiment of the present invention. Although specific steps are disclosed in FIG. 6, such steps are examples for illustrative purposes. That is, the present invention is well suited to performing various other steps or variations of the steps recited in FIG. 6. FIG. 6 is described in combination with FIG. 2, FIG. 3, FIG. 4 and FIG. 5.

At step 602, a sensed signal SEN is generated by sensing an input signal IN of a detection circuit (e.g., 200, 300, 400 or 500), and the input signal IN represents a status, e.g., a cell voltage, of a battery cell (e.g., 201 or 301). The detection circuit detects the occurrence of an abnormal condition, e.g., an over-voltage condition or an under-voltage condition, in the battery cell based on the input signal IN.

At step 604, a signal reference REF is determined at a specific node inside a signal reference source (e.g., 205, 305 or 505), e.g., the reference node K. The signal reference REF is substantially constant if an ambient condition, e.g., ambient temperature, varies.

At step 606, the sensed signal SEN is provided to the specific node, to bias the signal reference source.

At step 608, a trigger signal TRG is generated by signal reference source to indicate a difference between the sensed signal SEN and the signal reference REF.

At step 610, an output signal OUT is generated by the detection circuit. The output signal OUT indicates an abnormal condition in the battery cell.

In summary, embodiments according to the present invention provide detection circuits that detect an abnormal condition such as over-voltage condition and/or under-voltage condition in battery cells. A signal reference source, such as a bandgap voltage reference, determines a signal reference that is substantially constant if an ambient condition, e.g., ambient temperature, varies and at the same time compares a sensed signal indicative of a cell voltage with this signal reference. The comparison of the sensed signal and the signal reference is executed accurately without using a comparator or the like. The detection circuit can be used in various applications. For example, it can be combined with similar circuits and used in a battery monitoring system to monitor cell voltages of multiple cells and to monitor a charging/discharging current of the cells. It can also be used in medical equipment to monitor signals indicative of heartbeat information, sphygmus information, blood-pressure information, etc.

While the foregoing description and drawings represent embodiments of the present invention, it will be understood that various additions, modifications and substitutions may be made therein without departing from the spirit and scope of the principles of the present invention. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, and not limited to the foregoing description.

What is claimed is:

1. A detection circuit comprising:
a sensing unit that provides a sensed signal and a bias signal by sensing an input signal representing a status of a battery;
a signal reference source, coupled to said sensing unit and comprising a reference node, that determines a signal reference at said reference node and that receives and is biased by said sensed signal at said reference node to generate a trigger signal indicative of a difference between said sensed signal and said signal reference, wherein said signal reference source comprises:
a first transistor and a second transistor, coupled to said reference node, that receive and are biased by said sensed signal via said reference node; and
a third transistor and a fourth transistor, coupled to a connection node, that receive and are biased by said bias signal via said connection node,
wherein said third transistor comprises a first terminal coupled to said first transistor and comprises a second terminal coupled to said connection node, and wherein said fourth transistor comprises a first terminal coupled to said second transistor and comprises a second terminal coupled to said connection node; and
a detecting unit, coupled to said signal reference source, that generates an output signal according to said trigger signal to indicate an abnormal condition is present in said battery.

2. The detection circuit as claimed in claim 1, wherein said signal reference source comprises a bandgap reference circuit capable of providing, at said reference node, a voltage reference that remains substantially constant if an ambient condition varies, and wherein said signal reference comprises said voltage reference.

3. The detection circuit as claimed in claim 2, wherein said bandgap reference circuit compares said sensed signal with said voltage reference to generate said trigger signal.

4. The detection circuit as claimed in claim 1, wherein said detecting unit comprises a switch controlled by said trigger signal, and wherein said detecting unit generates said output signal based on a state of said switch.

5. The detection circuit as claimed in claim 4, wherein if said sensed signal is greater than said signal reference, then said switch is in a first state and said output signal is at a first output level; and wherein if said sensed signal is less than said signal reference, then said first switch is in a second state and said output signal is at a second output level.

6. The detection circuit as claimed in claim 1, wherein said abnormal condition comprises an over-voltage condition of said battery, and wherein said signal reference represents an over-voltage threshold of said battery.

7. The detection circuit as claimed in claim 1, wherein said abnormal condition comprises an under-voltage condition of said battery, and wherein said signal reference represents an under-voltage threshold of said battery.

8. The detection circuit as claimed in claim 1, wherein said sensing unit comprises a plurality of resistive components coupled in series and capable of providing said sensed signal and said bias signal.

9. A method comprising:
generating a sensed signal and a bias signal by sensing an input signal representing a status of a battery;
determining a signal reference at a reference node inside a signal reference source;
providing said sensed signal to said reference node and said bias signal to a connection node thereby biasing said signal reference source;
generating a trigger signal to indicate a difference between said sensed signal and said signal reference based on said determining and said providing; and
generating an output signal according to said trigger signal to indicate an abnormal condition is present in said battery,
wherein said providing comprises:
providing said sensed signal to said reference node to bias a first transistor and a second transistor;
providing said bias signal to said connection node to bias a third transistor and a fourth transistor,
wherein said third transistor comprises a first terminal coupled to said first transistor and comprises a second terminal coupled to said connection node, and wherein said fourth transistor comprises a first terminal coupled to said second transistor and comprises a second terminal coupled to said connection node.

10. The method as claimed in claim 9, wherein said generating said trigger signal comprises:
providing a voltage reference at said reference node using a bandgap reference circuit, wherein said signal reference comprises said voltage reference, and wherein said voltage reference remains substantially constant if an ambient condition varies; and
comparing said sensed signal with said voltage reference at said reference node to generate said trigger signal.

11. The method as claimed in claim 9, wherein said generating said output signal comprises:
controlling a switch via said trigger signal; and
generating said output signal according to a state of said switch.

12. The method as claimed in claim 11, wherein said generating said output signal according to said state of said switch comprises:
generating said output signal at a first output level according to said switch in a first state, if said sensed signal is greater than said signal reference; and
generating said output signal at a second output level according to said switch in a second state, if said sensed signal is less than said signal reference.

13. The method as claimed in claim 9, wherein said abnormal condition is a condition selected from the group consisting of: an over-voltage condition of said battery and an under-voltage condition of said battery.

14. A detection circuit comprising:
a first input terminal that receives a sensed signal representing a status of a battery;
a second input terminal that receives a bias signal representing said status of said battery;
an output terminal that generates an output signal to indicate an abnormal condition is present in said battery; and
detection circuitry, coupled to said first and second input terminals and said output terminal, that determines a signal reference at a reference node inside said detection circuitry, and that receives said sensed signal at said reference node to generate said output signal based on a difference between said sensed signal and said signal reference, wherein said detection circuitry comprises:
a first transistor and a second transistor, coupled to said reference node, that receive and are biased by said sensed signal via said reference node; and
a third transistor and a fourth transistor, coupled to a connection node, that receive and are biased by said bias signal via said connection node,
wherein said third transistor comprises a first terminal coupled to said first transistor and comprises a second terminal coupled to said connection node, and wherein said fourth transistor comprises a first terminal coupled to said second transistor and comprises a second terminal coupled to said connection node.

15. The detection circuit as claimed in claim 14, wherein said detection circuitry comprises a bandgap reference circuit capable of providing, at said reference node, a voltage reference that remains substantially constant if an ambient condition varies, and wherein said signal reference comprises said voltage reference.

16. The detection circuit as claimed in claim 15, wherein said sensed signal and said voltage reference are compared at said reference node using said bandgap reference circuit, and a trigger signal is generated at a trigger node of said bandgap reference circuit to indicate a difference between said sensed signal and said voltage reference.

17. The detection circuit as claimed in claim 14, wherein said detection circuitry comprises a switch controlled based on said difference between said sensed signal and said signal reference, and wherein said output signal is generated based on a state of said switch.

18. The detection circuit as claimed in claim 17, wherein if said sensed signal is greater than said voltage reference, then said switch is in a first state and said output signal is at a first output level; and wherein if said sensed signal is less than said voltage reference, then said first switch is in a second state and said output signal is at a second output level.

19. The detection circuit as claimed in claim 14, wherein said abnormal condition comprises an over-voltage condition of said battery, and wherein said signal reference represents an over-voltage threshold of said battery.

20. The detection circuit as claimed in claim 14, wherein said abnormal condition comprises an under-voltage condition of said battery, and wherein said signal reference represents an under-voltage threshold of said battery.

* * * * *